United States Patent
Tsai et al.

(10) Patent No.: US 9,905,430 B1
(45) Date of Patent: Feb. 27, 2018

(54) METHOD FOR FORMING SEMICONDUCTOR STRUCTURE

(71) Applicant: UNITED MICROELECTRONICS CORP., Hsin-Chu (TW)

(72) Inventors: Fu-Shou Tsai, Keelung (TW); Yu-Ting Li, Chiayi (TW); Li-Chieh Hsu, Taichung (TW); Yi-Liang Liu, Tainan (TW); Kun-Ju Li, Tainan (TW); Po-Cheng Huang, Kaohsiung (TW); Chien-Nan Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/245,194

(22) Filed: Aug. 24, 2016

(51) Int. Cl.
- H01L 21/84 (2006.01)
- H01L 21/3105 (2006.01)
- H01L 21/02 (2006.01)
- H01L 21/311 (2006.01)
- H01L 21/8234 (2006.01)

(52) U.S. Cl.
CPC .... H01L 21/31055 (2013.01); H01L 21/0217 (2013.01); H01L 21/02164 (2013.01); H01L 21/02227 (2013.01); H01L 21/02271 (2013.01); H01L 21/31111 (2013.01); H01L 21/823431 (2013.01)

(58) Field of Classification Search
CPC .......... H01L 21/31055; H01L 21/0217; H01L 21/02164; H01L 21/02227; H01L 21/02271; H01L 21/82331
See application file for complete search history.

(56) References Cited

U.S. PATENT DOCUMENTS

| | | | |
|---|---|---|---|
| 7,719,047 B2 * | 5/2010 | Choi | B82Y 10/00 257/314 |
| 8,329,587 B2 | 12/2012 | Liang et al. | |
| 8,455,268 B2 * | 6/2013 | Lee | H01L 21/28273 216/39 |
| 9,240,350 B2 * | 1/2016 | Godet | H01L 21/02321 |
| 2007/0048957 A1 * | 3/2007 | Lee | H01L 21/28282 438/324 |
| 2011/0212620 A1 | 9/2011 | Liang et al. | |

* cited by examiner

Primary Examiner — Savitr Mulpuri
(74) Attorney, Agent, or Firm — Winston Hsu

(57) ABSTRACT

A method for forming a semiconductor structure includes following steps. A substrate is provided, and a semiconductor layer is formed on the substrate. Next, a SiN-rich pre-oxide layer is formed on the semiconductor layer. After forming the SiN-rich pre-oxide layer, an anneal treatment is performed to partially transfer the SiN-rich pre-oxide layer to form a SiN layer and a SiO layer. And the SiO layer is formed the on the SiN layer. Subsequently, a planarization process is performed to remove a portion of the SiO layer to expose the SiN layer.

16 Claims, 3 Drawing Sheets

US 9,905,430 B1

METHOD FOR FORMING SEMICONDUCTOR STRUCTURE

BACKGROUND OF THE INVENTION

1. Field of the Invention

The present invention generally relates to a method for forming a semiconductor structure, and more particularly, to a method for forming a semiconductor structure using planarization process.

2. Description of the Prior Art

Integrated circuits (ICs) are typically formed on substrates, exemplarily silicon wafers, by sequential deposition of conductive, semi-conductive or insulating layers. After depositing the required layer, etching process is often performed to create circuitry features and followed by another film/layer formation. Consequently, the topmost surface of the substrate may become non-planar across its surface and requires planarization.

Chemical-mechanical polishing (hereinafter abbreviated as CMP) is one accepted method of planarization and now typically employed in the industry. In general, CMP involves pressing a surface of the substrate against a polishing pad that is mounted upon a circular turning platen with a polishing head tightly holds the substrate. Slurries, usually either are basic or acidic and generally contain particles, are delivered to the center of the polishing pad to chemically passivate or oxidize the surface being polished and abrasively remove or polish off the surface of the substrate. The interaction of the polishing pad and the slurries with the surface being polished results in controlled polishing of the desired surface for subsequent processes.

Typically, CMP process maybe carried out on separated platens, even in separate CMP systems because different slurry compositions/chemistries are needed to polish different layers. Furthermore, to obtain a precise stop surface, different stop layers are required. That is, CMP requires multiple and complicated steps. In other words, steps of CMP process are complicated. As compared to a hypothetical single step process, such multi-stepped process adds to cycle time, adds to fabrication cost, and can increase defect density. Therefore CMP processes or pre-CMP processes with reduced step number are in need.

SUMMARY OF THE INVENTION

According to an aspect of the present invention, a method for forming a semiconductor structure is provided. The method includes following steps. A substrate is provided, and a semiconductor layer is formed on the substrate. Next, a silicon nitride (hereinafter abbreviated as SiN)-rich pre-oxide layer is formed on the semiconductor layer. After forming the SiN-rich pre-oxide layer, an anneal treatment is performed to partially transfer the SiN-rich pre-oxide layer to form a SiN layer and a silicon oxide (hereinafter abbreviated as SiO) layer. And the SiO layer is formed the on the SiN layer. Subsequently, a planarization process is performed to remove a portion of the SiO layer to expose the SiN layer.

According to the method for forming the semiconductor structure provided by the present invention, the SiN-rich pre-oxide layer is formed and partially transferred by the anneal treatment, and thus the SiN layer and the SiO layer formed thereon are obtained. In other words, only one deposition is required since the SiN layer and the SiO layer are obtained by performing the anneal treatment. However, the SiN layer, which is a sufficient stop layer for the planarization process, is still remained. Consequently, step number for the planarization process is reduced without impacting the planarization result, and thus throughput is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a method for forming a semiconductor structure provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Figure 1:
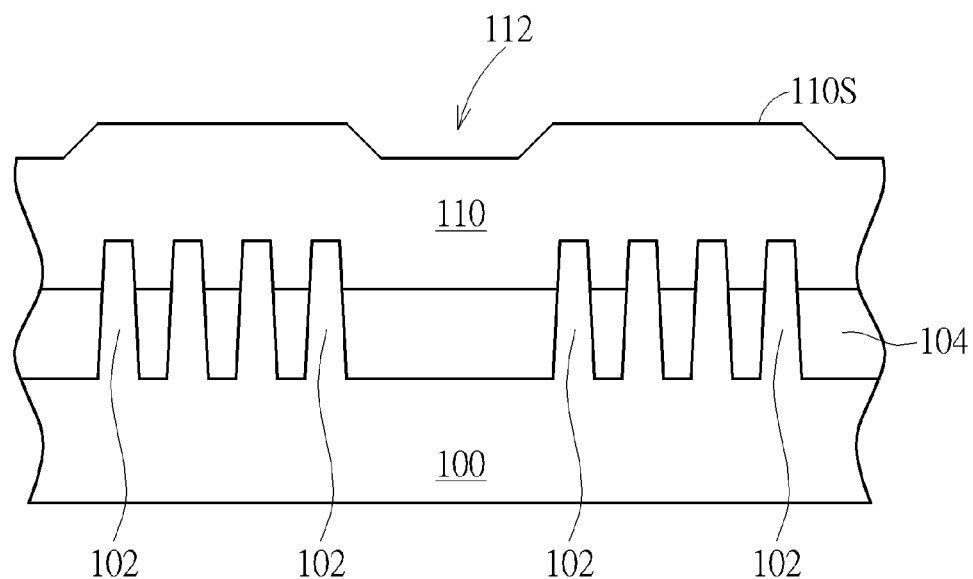

Please refer to FIGS. 1-5, which are schematic drawings illustrating a method for forming a semiconductor structure provided by a preferred embodiment of the present invention. As shown in FIG. 1, a substrate 100 is provided. The substrate 100 includes, for example but not limited to, silicon (Si), germanium (Ge), III-V compound, or II-VI compound. The substrate 100 includes a plurality of fin structures 102 and at least an insulating layer 104 formed thereon. And the fin structures 102 are protruded from a surface of the insulating layer 104. The fin structure 102 as shown in FIG. 1 can be formed by patterning a single crystalline silicon layer of a SOI substrate or a bulk silicon substrate by photolithographic etching pattern (PEP) method, multi patterning method, or, preferably, spacer self-aligned double-patterning (SADP), also known as sidewall image transfer (SIT) method. Also as shown in FIG. 1, the fin structures 102 maybe formed indifferent regions, therefor densities of the fin structures 102 over the substrate 100 may not always be the same.

Please still refer to FIG. 1. Next, a semiconductor layer 110 is formed on the substrate 100. Particularly, the semiconductor layer 110 is formed on the fin structures 102 and the insulating layer 104. Additionally, a gate dielectric layer (not shown) can be formed in between the semiconductor layer 110 and the fin structures 102/insulating layer 104. In some embodiments, the semiconductor layer 110 includes an amorphous silicon layer. In other embodiments, the semiconductor layer 110 includes a polysilicon layer. However, in still other embodiments the semiconductor layer 110 can include other semiconductor material. A thickness of the semiconductor layer 110 can be smaller than 2000 angstroms (Å), but not limited to this. It is noteworthy that, since the densities of the fin structures 102 over the substrate 100 may not always be the same, a recess 112 may be formed after forming the semiconductor layer 110. As shown in FIG. 1, the recess 112 is formed correspondingly to an iso region (the area with relative lower pattern density). In other words, a top surface 110S of the semiconductor layer 110 is not an even and uniform surface, and a topography variation is caused. The topography variation may impair the follow-up processes and thus the product characteristics.

Figure 2:
Figure 2:
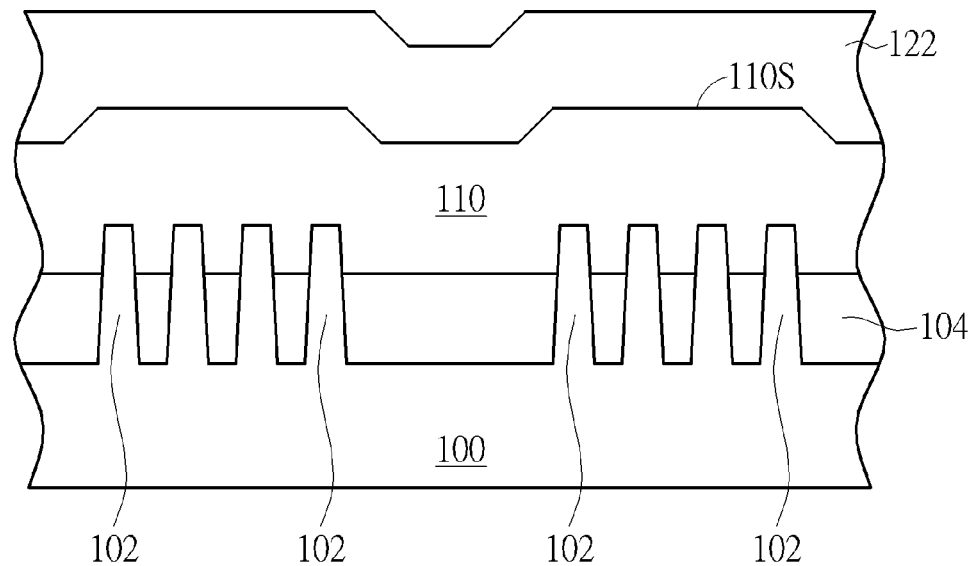

Please refer to FIG. 2. After forming the semiconductor layer 110, a SiN-rich pre-oxide layer 122 is formed on the semiconductor layer 110. The SiN-rich pre-oxide layer 122 is formed by a flowable chemical vapor deposition (hereinafter abbreviated as FCVD) 120. Specifically, at least a precursor is provided in the FCVD 120, and the precursor includes nitrogen. Thus the SiN-rich pre-oxide layer 122 includes both SiN and SiO. It is noteworthy that since the SiN-rich pre-oxide layer 122 is formed by the FCVD 120, it includes a flowable characteristic. That is, the SiN-rich pre-oxide layer 122 is flowable and therefore is able to flow into the narrow gaps or trenches. In the preferred embodiment, a thickness of the SiN-rich pre-oxide layer 122 can be 1000 Å, but not limited to this.

Figure 3:
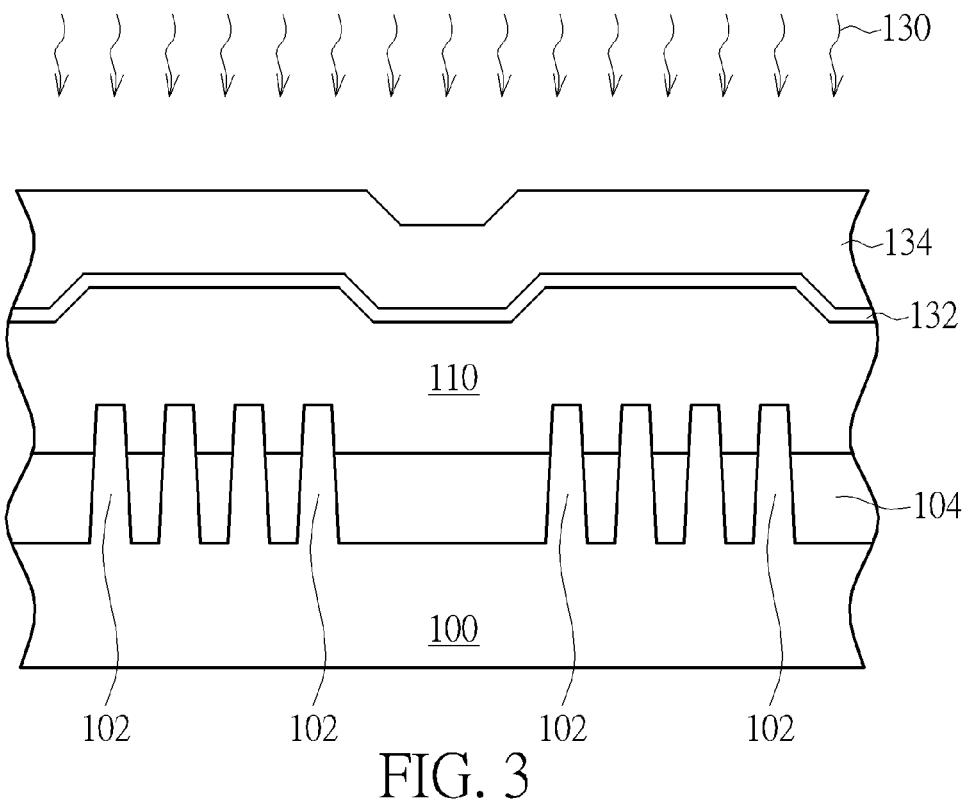

Please refer to FIG. 3. After forming the SiN-rich pre-oxide layer 122, an anneal treatment 130 is performed. The anneal treatment 130 is performed to harden or cure the flowable SiN-rich pre-oxide layer 122. In those embodiments that the semiconductor layer 110 includes the amorphous silicon layer, a temperature of the anneal treatment 130 is lower than 580° C., and a process time of the anneal treatment 130 is over 14 hours. It is noteworthy that the temperature of the anneal treatment 130 must be lower than 580° C., so that the amorphous silicon layer is prevented from re-crystalizing into a polysilicon layer. And in those embodiments that the semiconductor layer 110 includes the polysilicon layer, the temperature of the anneal treatment 130 can be higher than 1000° C., and the process time of the anneal treatment is less than 12 hours. More important, the anneal treatment 130 is performed not only to cure the flowable SiN-rich pre-oxide layer 122, but also to partially transfer the SiN-rich pre-oxide layer 122 to form a SiN layer 132 and a SiO layer 134, and the SiO layer 134 is formed the on the SiN layer 132. During the anneal treatment 130, the SiN-rich pre-oxide layer 122 is transferred from its surface. Therefore, as shown in FIG. 3, the upper portion of the SiN-rich pre-oxide layer 122 is transferred into the SiO layer 134 while the lower portion of the SiN-rich pre-oxide layer is transferred into a SiN layer 132. Thus, the SiN layer 132 contacts the semiconductor layer 110. It is noteworthy that the thermal budget of the anneal treatment 130 must controlled so that the SiN-rich pre-oxide layer 122 is not entirely transferred into the SiO layer. Therefore, the process time of the anneal treatment 130 must be less than 12 hours in those embodiments with the temperature higher than 1000° C. Additionally, to facilitate the transfer in the upper portion of the SiN-rich pre-oxide layer 122, $H_2O$ can be provided into in the anneal treatment, but not limited to this. Since the SiO layer 134 and the SiN layer 132 are obtained by transferring the SiN-rich pre-oxide layer 122, a sum of a thickness of the SiO layer 134 and a thickness of the SiN layer 132 is equal to a thickness of the SiN-rich pre-oxide layer 122. Furthermore, a thickness of the SiO layer 134 is larger than a thickness of the SiN layer 132 as shown in FIG. 3.

Figure 4:
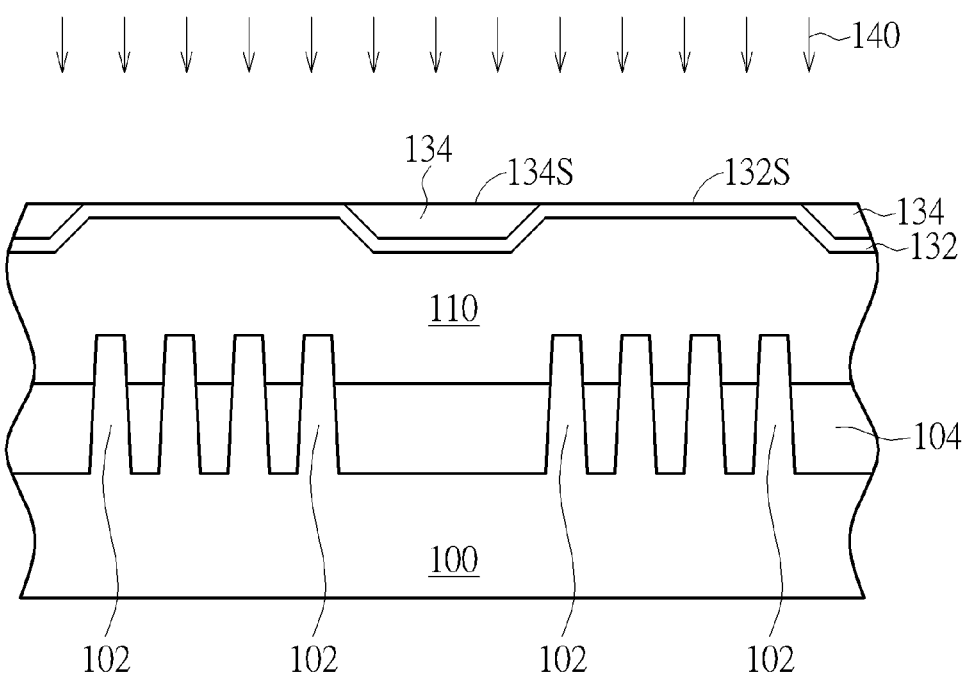

Please refer to FIG. 4. After the anneal treatment 130, a planarization process 140, such as a chemical mechanical polishing (CMP) process, is performed to remove a portion of the SiO layer 134 to expose the SiN layer 132. Consequently, a top surface 132S of the SiN layer 132 and a top surface 134S of the remnant SiO layer 134 are coplanar. It is noteworthy that since the etching rate of the SiN layer 132 is quite different from the etching rate of the SiO layer 134, the SiN layer 132 serves as a sufficient stop layer in the planarization process 140.

Figure 5:
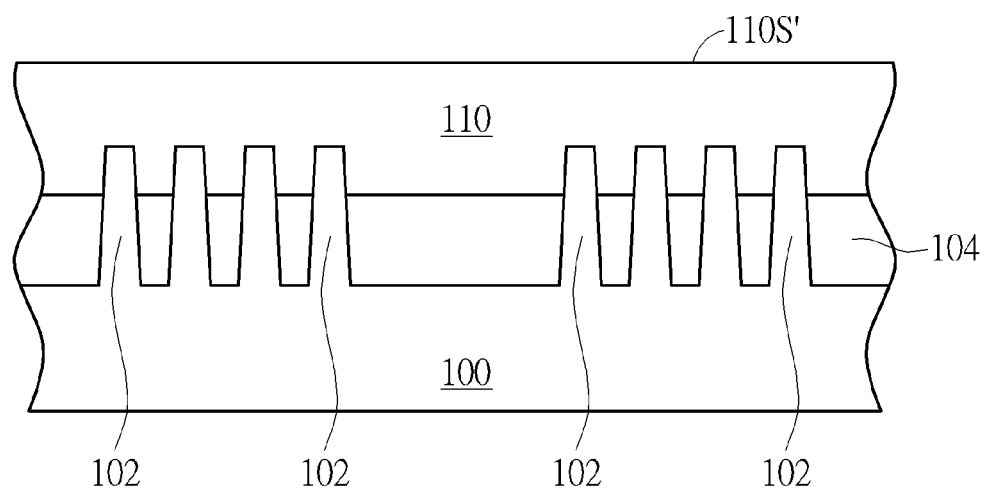

Please refer to FIG. 5. An etching back process 142 is then performed to remove the remnant SiO layer 134, the SiN layer 132 and a portion of the semiconductor layer 110. The etching back process 142 preferably includes a non-selective etchant, and thus the remnant SiO layer 134 and the SiN layer 132 are entirely removed. More important, a portion of the semiconductor layer 110 is removed so that the recess 112 is eliminated as shown in FIG. 5. Accordingly, the top surface 110S' of the semiconductor layer 110 after the planarization process 140 and the etching back process 142 has an even topography.

Additionally, the semiconductor layer 110 can be patterned to expose portions of the fin structures 102, and followed by performing any required process for forming devices. For example, ion implantations for forming lightly-doped drains (LDDs) and source/drains can be performed. It should be easily realized by those skilled in the art that other processes can be performed if required, and those details are all omitted in the interest of brevity.

According to the method for forming the semiconductor structure provided by the present invention, the SiN-rich pre-oxide layer is formed and partially transferred, and thus the SiN layer and the SiO layer formed thereon are obtained. Since the SiN-rich pre-oxide layer are entirely transferred into the SiO layer, thermal budget is reduced. More important, only one deposition is required since the SiN layer and the SiO layer are obtained by performing the anneal treatment. Compared with the prior art that requires two depositions (one for forming the SiO layer and one for forming the etch stop SiN layer), the step number of the method for forming the semiconductor structure provide by the present invention is reduced. However, the SiN layer, which is a sufficient stop layer for planarization process, is still remained. Briefly speaking, step number for the planarization process is reduced without impacting planarization result. Thus, throughput is improved in accordance with the method for forming the semiconductor structure provided by the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   providing a substrate;
   forming a semiconductor layer on the substrate;
   forming a silicon nitride (SiN)-rich pre-oxide layer on the semiconductor layer;
   performing an anneal treatment to partially transfer the SiN-rich pre-oxide layer to form a SiN layer and a silicon oxide (SiO) layer, and the SiO layer being formed the on the SiN layer;
   performing a planarization process to remove a portion of the SiO layer to expose the SiN layer; and
   after the planarization process, performing an etching back process to remove the SiO layer, the SiN layer and a portion of the semiconductor layer.

2. The method for forming the semiconductor structure according to claim 1, wherein the substrate comprises a plurality of fin structures and at least an insulating layer formed thereon.

3. The method for forming the semiconductor structure according to claim 2, wherein the semiconductor layer is formed on the fin structures and insulating layer.

4. The method for forming the semiconductor structure according to claim 1, wherein the semiconductor layer comprises an amorphous silicon layer.

5. The method for forming the semiconductor structure according to claim 4, wherein a temperature of the anneal treatment is lower than 580° C.

6. The method for forming the semiconductor structure according to claim 4, wherein a process time of the anneal treatment is over 14 hours.

7. The method for forming the semiconductor structure according to claim 1, wherein the semiconductor layer comprises a polysilicon layer.

8. The method for forming the semiconductor structure according to claim 7, wherein a temperature of the anneal treatment is higher than 1000° C.

9. The method for forming the semiconductor structure according to claim 7, wherein a process time of the anneal treatment is less than 12 hours.

10. The method for forming the semiconductor structure according to claim 1, wherein the SiN-rich pre-oxide layer is formed by a flowable chemical vapor deposition (FCVD).

11. The method for forming the semiconductor structure according to claim 10, further comprising providing a precursor in the FCVD.

12. The method for forming the semiconductor structure according to claim 11, wherein the precursor comprises nitrogen.

13. The method for forming the semiconductor structure according to claim 1, further comprising providing $H_2O$ in the anneal treatment.

14. The method for forming the semiconductor structure according to claim 1, wherein a sum of a thickness of the SiN layer and a thickness of the SiO layer is equal to a thickness of the SiN-rich pre-oxide layer.

15. The method for forming the semiconductor structure according to claim 14, wherein a thickness of the SiO layer is larger than a thickness of the SiN layer.

16. The method for forming the semiconductor structure according to claim 1, wherein the SiN layer contacts the semiconductor layer.

* * * * *